United States Patent
Breitwisch et al.

(10) Patent No.: US 8,445,313 B2
(45) Date of Patent: *May 21, 2013

(54) METHOD FOR FORMING A SELF-ALIGNED BIT LINE FOR PCRAM AND SELF-ALIGNED ETCH BACK PROCESS

(75) Inventors: Matthew J. Breitwisch, Yorktown Heights, NY (US); Chieh-Fang Chen, Taipei County (TW); Shih-Hung Chen, HsinChu County (TW); Eric A. Joseph, White Plains, NY (US); Chung Hon Lam, Peekskill, NY (US); Michael F. Lofaro, Hopewell Junction, NY (US); Hsiang-Lan Lung, Dobbs Ferry, NY (US); Alejandro G. Schrott, New York, NY (US); Min Yang, Yorktown Heights, NY (US)

(73) Assignees: International Business Machines Corporatoin, Armonk, NY (US); Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/546,684

(22) Filed: Jul. 11, 2012

(65) Prior Publication Data
US 2012/0276688 A1 Nov. 1, 2012

Related U.S. Application Data

(63) Continuation of application No. 13/020,051, filed on Feb. 3, 2011, now Pat. No. 8,273,598.

(51) Int. Cl.
*H01L 21/00* (2006.01)

(52) U.S. Cl.
USPC .. 438/95; 257/2; 257/E21.068; 257/E31.008; 365/148; 365/163; 438/102; 438/381

(58) Field of Classification Search
USPC ............... 257/2, E21.068, E31.008; 365/148, 365/163; 438/95, 102, 361
See application file for complete search history.

(56) References Cited

U.S. PATENT DOCUMENTS

| | | |
|---|---|---|
| 7,314,776 B2 | 1/2008 | Johnson et al. |
| 2002/0160551 A1 | 10/2002 | Harshfield |
| 2006/0063308 A1 | 3/2006 | Shim |
| 2009/0148981 A1 | 6/2009 | Lai et al. |
| 2012/0202333 A1* | 8/2012 | Breitwisch et al. ........... 438/381 |

* cited by examiner

*Primary Examiner* — Asok K Sarkar
(74) *Attorney, Agent, or Firm* — Scully, Scott, Murphy & Presser, P.C.; Vazken Alexanian (57) ABSTRACT

A method of forming bit line aligned to a phase change material that includes forming a pedestal of a sacrificial material on a portion of a lower electrode and forming at least one dielectric material adjacent to the sacrificial material, wherein the at least one dielectric material has an upper surface substantially coplanar with an upper surface of the pedestal of the sacrificial material. The pedestal of the sacrificial material is removed selective to the at least one dielectric material and the lower electrode to provide an opening to an exposed surface of the lower electrode. A phase change material is formed on the exposed surface of the lower electrode, and the opening is filled with a conductive fill material. A self-aligned etch back process is also provided.

17 Claims, 6 Drawing Sheets

FIG. 17 ved on the bottom surface of the lower electrode to provide an opening to an exposed surface of the lower electrode. A phase change material is deposited on the exposed surface of the lower electrode.

METHOD FOR FORMING A SELF-ALIGNED BIT LINE FOR PCRAM AND SELF-ALIGNED ETCH BACK PROCESS

CROSS REFERENCE TO RELATED APPLICATION

This application is a continuation of U.S. patent application Ser. No. 13/020,051, filed Feb. 3, 2011 the entire content and disclosure of which is incorporated herein by reference.

BACKGROUND

The present disclosure relates to semiconductor devices including phase change materials.

Phase change random access memory (PRAM) devices store data using a phase change material, such as, for example, a chalcogenide alloy, that transforms into a crystalline state or an amorphous state during cooling after a heat treatment. Each state of the phase change material has different resistance characteristics. Specifically, the phase change material in the crystalline state has low resistance and the phase change material in the amorphous state has high resistance. The crystalline state is typically referred to as a "set state" having a logic level "0", and the amorphous state is typically referred to as a "reset state" having a logic level "1". To form a reset state, a high current density pulse is applied to the phase change material through an electrode.

SUMMARY

In one aspect, the present disclosure provides a method of forming a device including a phase change material. In one embodiment, a method is provided that produces a self-aligned bit line for phase change material random access memory (PCRAM) devices, in which the bit line is aligned to the phase change material of the phase change material random access memory (PCRAM) device. In one embodiment, the method includes forming a pedestal of a sacrificial material on a portion of a lower electrode. At least one dielectric material is formed adjacent to the sacrificial material. The at least one dielectric material has an upper surface that is substantially coplanar with an upper surface of the pedestal of the sacrificial material. The pedestal of the sacrificial material is removed selective to the at least one dielectric material and the lower electrode to provide an opening to an exposed surface of the lower electrode. A phase change material is deposited on the exposed surface of the lower electrode. The opening is then filled with a conductive fill material. The conductive fill material may provide a bit line that is aligned to the phase change material.

In another aspect, a self-aligned etch back process is employed to provide a semiconductor device including a phase change material, such as a phase change material random access memory (PCRAM) device. In one embodiment, the method includes providing an opening through a material stack to a lower electrode, and depositing a phase change material on an exposed surface of the lower electrode. An upper electrode is formed on the phase change material that is present within the opening, wherein electrically conductive material that provides the upper electrode is also formed overlying an upper surface of the material stack. The opening is filled with an etch stop material. Following the formation of the etch stop material, the portion of the upper electrode that is overlying the upper surface of the material stack is etched. During etching, the portion of the upper electrode that is present within the opening is protected by the etch stop material. The etch stop material is then removed by an etch that is selective to the upper electrode and the material stack. A via may be formed in electrical communication with the upper electrode.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the present disclosure are disclosed herein; however, it is to be understood that the disclosed embodiments are merely illustrative of the invention that may be embodied in various forms. In addition, each of the examples given in connection with the various embodiments of the present disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention. References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures.

The embodiments of the present disclosure relate to novel memory devices and methods of forming memory devices. FIGS. 1 to 10 depict embodiments of the present method and structures relating thereto for forming a bit line that is self-aligned to a phase change material. In the embodiments that are depicted in FIGS. 1 to 10, the phase change material is a component of a memory device. As used herein, the term "memory device" means a structure in which the electrical state of which can be altered and then retained in the altered state, in this way a bit of information can be stored. The memory device may be a volatile memory device or a non-volatile memory device. "Volatile memory" means memory in which stored information is lost when power to the memory cell is turned off. "Non-volatile memory" means information stored is maintained after the power to the memory cell is turned off. In one embodiment, the memory device may be a phase change memory device, such as a phase change random access memory device (PCRAM). As used herein, a "phase change memory cell" means a structure including at least one phase change material that is interposed between two contacts, where at least a portion of the phase change material can be switched from an amorphous state into a crystalline state, and vise-versa, by application of energy. The crystalline state of the phase change material has a lower resistivity than the amorphous state of the phase change material. The different resistivity states may provide the electrical performance by which a bit of information can be formed.

Figure 1:
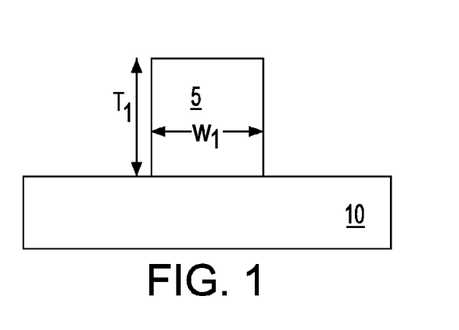
FIG. 1 is a side cross-sectional view of an initial structure for one embodiment of a method of forming a bit line that is self-aligned to a phase change material in accordance with the present disclosure, in which a pedestal of a sacrificial material is formed on a portion of a lower electrode.

FIG. 1 depicts a pedestal 5 of a sacrificial material that is formed on a portion of a lower electrode 10. As used herein, an "electrode" is a structure composed of an electrically conductive material that applies external energy to a phase change material. In some embodiments, by "electrically conductive" it is meant that the material being described or electrically conductive has a room temperature conductivity of greater than $10^{-8}$ $(\Omega\text{-m})^{-1}$. The term "electrical contact" denotes direct contact between two materials, wherein the interface between the two materials is electrically conductive.

The lower electrode 10 may be formed on the upper surface of a substrate (not shown) or may be formed within a substrate (not shown). In one embodiment, the substrate that is in contact with the lower electrode 10 may include any number of active and/or passive devices (or regions). For example, the substrate may comprise any semiconductor material including, but not limited to, Si, Ge, SiGe, SiC, SiGeC, InAs, GaAs, InP and other III/V compound semiconductors.

In one embodiment, the lower electrode 10 is formed atop the substrate using deposition, etching and planarization. More specifically, and in one embodiment of the disclosure, the lower electrode 10 is formed within a lower dielectric (not shown) atop a substrate, by a deposition process including, for example, chemical vapor deposition (CVD) or physical vapor deposition (PVD). Illustrative examples of suitable materials for the lower electrode 10 include, but are not limited to, Cu, W, Ti, Al, Ni, Ta, Au, Ag, metal semiconductor alloys or combinations thereof. In one example, the lower electrode 10 is composed of silicon nitride. The lower electrode 10 may also be referred to as a heater. Any material is suitable for the lower electrode 10, so long as the material is suitable for supplying enough energy for effectuating a phase change in the phase change material of the subsequently formed phase change material memory device.

FIG. 1 depicts one embodiment of forming a pedestal 5 of a sacrificial material on a portion of the lower dielectric/electrode 10. The pedestal 5 of the sacrificial material is a structure that defines the geometry of the later formed opening to the portion of the lower electrode 10 on which the phase change material is subsequently formed. In one embodiment, as illustrated in FIG. 1, the pedestal 5 of the sacrificial material may be composed of a single layer of sacrificial material. In another embodiment, forming the pedestal 5 of the sacrificial material includes forming a material stack (not depicted) on the lower electrode 10, in which the sacrificial material stack may be composed of a plurality of layers of sacrificial material.

In one embodiment, the sacrificial material that provides the pedestal 5 may be composed of a semiconductor-containing material, such as a silicon-containing material. Silicon-containing materials that are suitable for the pedestal 5 of sacrificial material include, but are not limited to, silicon (Si), single crystal silicon, polycrystalline silicon, amorphous silicon, $SiO_2$, $Si_3N_4$, $SiO_xN_y$, SiC, SiCO, SiCOH, and SiCH compounds, and the above-mentioned silicon-containing materials with some or all of the Si replaced by Ge. In one example, the sacrificial material that provides the pedestal 5 is amorphous silicon. It is noted that in some embodiments other materials, such as dielectrics and metals, can be employed for the sacrificial material that provides the pedestal 5, so long as the material selected can removed selectively to the lower electrode 10.

The material layer that provides the pedestal 5 of sacrificial material may be formed using a deposition process, such as chemical vapor deposition (CVD). Chemical vapor deposition (CVD) is a deposition process in which a deposited species is formed as a result of chemical reaction between gaseous reactants at an elevated temperature (typically being greater than 200° C.), wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The sacrificial material may also be deposited using evaporation, chemical solution deposition, spin on deposition, and physical vapor deposition (PVD) methods.

The layer of the sacrificial material may be patterned and etch to provide the pedestal 5. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied.

In one embodiment, the etch process removes the exposed portions of the sacrificial material layer with an etch chemistry that is selective to the lower electrode 10. In one embodiment, the etch process that forms the pedestal 5 of the sacrificial material is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

The width W1 of the pedestal 5 of sacrificial material may range from about 20 nm to about 250 nm. In another embodiment, the width W1 of the pedestal 5 of sacrificial material may range from about 50 nm to about 150 nm. In yet another embodiment, the width W1 of the pedestal 5 of sacrificial material may range from about 80 nm to about 100 nm. The thickness T1 of the pedestal 5 of sacrificial material may range from about 50 nm to about 500 nm. In another embodiment, the thickness T1 of the pedestal 5 of sacrificial material may range from about 100 nm to about 200 nm. In yet another embodiment, the thickness T1 of the pedestal 5 of sacrificial material may range from about 125 nm to about 175 nm.

Figure 2:
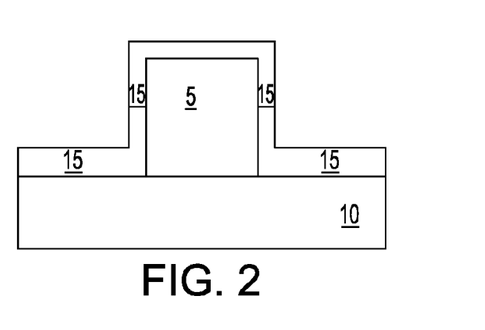
FIG. 2 is a side cross-sectional view depicting forming a conformal layer on the pedestal of the sacrificial material, in accordance with one embodiment of the present disclosure.

FIG. 2 depicts one embodiment of forming a conformal layer 15, e.g., conformal dielectric layer, on the pedestal 5 of the sacrificial material and the exposed portion of the lower electrode 10 that is adjacent to the pedestal 5 of the sacrificial material. In one embodiment, the conformal layer 15 is present on the upper surface of the pedestal 5 of the sacrificial material and the sidewalls of the pedestal 5 of the sacrificial material.

In one embodiment, the conformal layer 15 is a deposited material having a thickness that remains the same regardless of the geometry of underlying features on which the layer is deposited, wherein the thickness of the layer does not deviate from greater than or less than 20% of an average value for the thickness of the layer. The conformal layer 15 may be composed of a dielectric material, such as a nitride, oxide or oxynitride material. In one embodiment, the conformal layer 15 is composed of a nitride, such as silicon nitride ($Si_3N_4$). It is noted that the other materials are suitable for the conformal layer 15 so long as the pedestal 5 of the sacrificial material may be removed selectively to the conformal layer 15.

In one embodiment, the conformal layer 15 may be deposited by chemical vapor deposition (CVD) or atomic layer deposition (ALD). Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. In one embodiment, the thickness of the conformal layer 15 may range from about 5 nm to about 100 nm. In another embodiment, the thickness of the conformal layer 15 may range from about 20 nm to about 75 nm. In yet another embodiment, the thickness of the conformal layer 15 may range from about 30 nm to about 50 nm.

Figure 3:
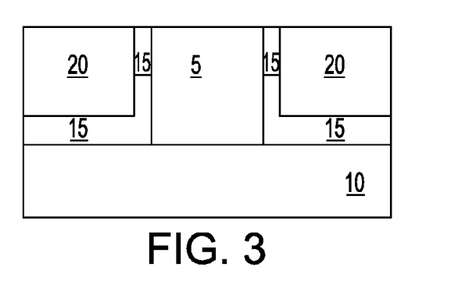
FIG. 3 is a side cross-sectional view depicting forming an interlevel dielectric layer on the conformal layer, and planarizing to remove the portion of the interlevel dielectric layer and the conformal layer that is overlying the pedestal of sacrificial material, in accordance with one embodiment of the present disclosure.

FIG. 3 depicts forming an interlevel dielectric layer 20 on the conformal layer 15, and planarizing to remove the portion of the interlevel dielectric layer 20 and the conformal layer 15 that overlie the pedestal 5 of sacrificial material. The interlevel dielectric layer 20 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric layer 20 include any of the aforementioned materials in porous form, or in a form that changes during processing to or from being porous and/or permeable to being non-porous and/or non-permeable.

The interlevel dielectric layer 20 may be formed by various deposition methods including, but not limited to, spinning from solution, spraying from solution, chemical vapor deposition (CVD), plasma enhanced CVD (PECVD), sputter deposition, reactive sputter deposition, ion-beam deposition, and evaporation. In one embodiment, the interlevel dielectric layer 20 is composed of silicon oxide ($SiO_2$) deposited by high density plasma chemical vapor deposition (HDPCVD). High density plasma chemical vapor deposition (HDPCVD) is a chemical vapor deposition process that utilizes a low pressure (2 mTorr to 10 mTorr range) to achieve a high electron density ($10^{10}$ $cm^3$-$10^{12}$ $cm^3$) and a high fractional ionization rate ($10^4$ to $10^{-1}$) for deposition. High density plasma chemical vapor deposition (HDPCVD) is typically a non-conformal deposition process.

The planarization process may be used to provide a planar structure, in which the upper surface of the planarized interlevel dielectric layer 20 is coplanar with the upper surface of the pedestal 5 of the sacrificial material. As used herein, "planarization" is a material removal process that employs at least mechanical forces, such as frictional media, to produce a planar surface. One example of a planarization process is chemical mechanical planarization. "Chemical mechanical planarization" is a material removal process using both chemical reactions and mechanical forces to remove material and planarize a surface. The planarization process typically removes the portion of the conformal layer 15 that is present on the upper surface of the pedestal 5 of the sacrificial material.

Figure 4:
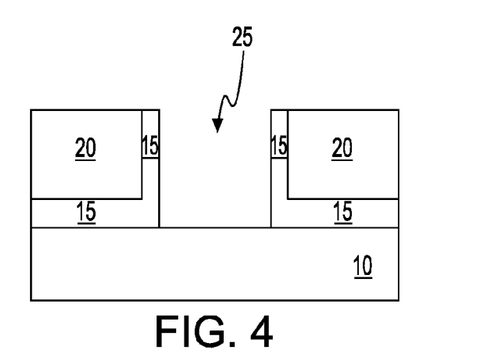
FIG. 4 is a side cross-sectional view depicting removing the pedestal of the sacrificial material selective to the conformal layer and the lower electrode to provide an opening to an exposed surface of the lower electrode, in accordance with one embodiment of the present disclosure.

FIG. 4 depicts removing the pedestal 5 of the sacrificial material selective to the conformal layer 15 and the lower electrode 10 to provide an opening 25 to an exposed surface of the lower electrode 10. The etch that removes the pedestal 5 of the sacrificial material may also be selective to the interlevel dielectric 20. In one embodiment, the etch process that removes the pedestal 5 of the sacrificial material may be an anisotropic etch or an isotropic etch. The etch process that removes the pedestal 5 of the sacrificial material may be a dry or a wet etch. In one embodiment, in which the sacrificial material of the pedestal 5 is amorphous silicon (Si), the interlevel dielectric layer 20 is composed of silicon oxide ($SiO_2$), and the conformal layer 15 and the lower electrode 10 are composed of silicon nitride ($Si_3N_4$), the etch that removes the pedestal 5 of sacrificial material may be a wet etch composed of potassium hydroxide (KOH).

Figure 5:
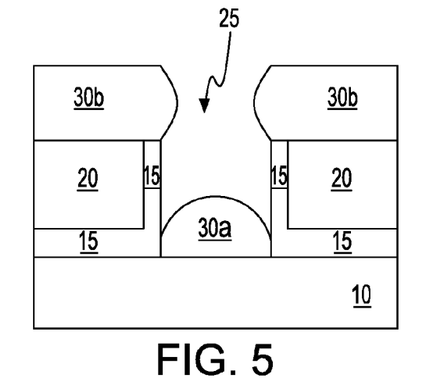
FIG. 5 is a side cross-sectional view depicting depositing a phase change material on the exposed surface of the lower electrode and the upper surface of the interlevel dielectric layer, in accordance with one embodiment of the present disclosure.

FIG. 5 depicts one embodiment of depositing a phase change material 30a, 30b on the exposed surface of the lower electrode 10 and the upper surface of the interlevel dielectric layer 20. The phase change material 30a, 30b may be formed in electrical contact with an exposed upper surface of the lower electrode 10. In one embodiment, the step of forming a phase change material 30a, 30b includes depositing a first portion of phase change material 30a composed of Ge, Sb, Te or a combination thereof atop the exposed portion of the lower electrode 10 within the opening 25, and a second portion of phase change material 30b composed of Ge, Sb, Te atop an upper surface of the interlevel dielectric layer 20 and the upper surface of the conformal layer 15. In one embodiment, forming a phase change material 30a, 30b includes chemical vapor deposition (CVD) or physical vapor deposition (PVD).

In one embodiment, the phase change material 30a, 30b may be switched from an amorphous phase to a crystalline phase. When in an amorphous state, the phase change material 30a, 30b is electrically insulating and functions similar to the gate dielectric of a metal oxide semiconductor field effect transistor (MOSFET). The term "chalcogenide" is used herein to denote an alloy or compound material, which contains at least one element from Group VI of the Periodic Table of Elements. Illustrative examples of chalcogenide alloys that can be employed herein include, but are not limited to, alloys of Te or Se with at least one of the elements of Ge, Sb, As, Si. In other embodiments, the phase change material is made of any suitable material including one or more of the elements Te, Ga, In, Se, and S. In one embodiment, the phase change material 30a, 30b has a composition of $Ge_2Sb_2Te_5$ (GST). Although chalcogenides are a group of materials commonly utilized as phase change material, some phase change materials, such as GeSb (GS), do not utilize, chalcogenides. Thus, a variety of materials can be used in the phase change material 30a, 30b so long as they can retain separate amorphous and crystalline states of distinct resistivity.

In one embodiment, a phase change material 30a, 30b composed of GST when at a temperature of about 25° C. is in an amorphous phase. As the temperature of the GST phase change material 30a, 30b is increased to about 125° C., the resistivity of the phase change material 30a, 30b decreases representing the transition temperature for a phase change from an amorphous phase to Face Center Cubic (FCC) phase. Further increases in the temperature of the GST phase change material 30a, 30b to greater than about 180° C. result in further decreases in resistivity, which result from a phase change from the Face Centered Cubic (FCC) phase to a Hexagonal (Hex) phase of the GST. When the temperature of the GST phase change material 30a, 30b is increased above the melting temperature (620° C.), the GST phase change material 30a, 30b melts and upon cooling, i.e. quench, returns to the amorphous solid phase.

In one embodiment, the thickness of the phase change material 30a, 30b may range from about 80 nm to about 500 nm. In another embodiment, the thickness of the phase change material 30a, 30b ranges from about 20 nm to about 400 nm. In yet another embodiment, the thickness of the phase change material 30a, 30b ranges from about 80 nm to about 200 nm. The thickness of the phase change material 30a, 30b should be thinner than the original height of the pedestal 5 of the sacrificial filler material 35. In some embodiments, the thickness of the phase change material 30a, 30b should be half the thickness than the original height of the pedestal 5 of the sacrificial filler material 35.

Figure 6A:
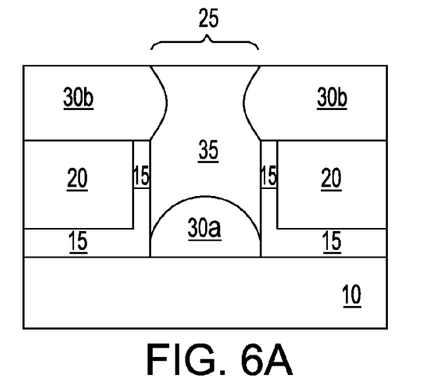
FIGS. 6A-6B depict some embodiments of depositing a spin-on-glass or a photoresist material filling the opening, in accordance with the present disclosure.
Figure 6B:
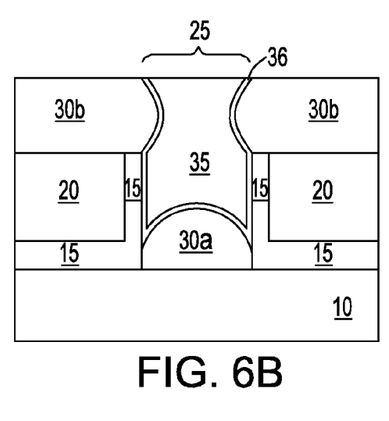

FIGS. 6A-6B depict depositing a sacrificial filler material 35 within the opening 25. In some embodiments, the sacrificial filler material 35 may be a spin-on-glass or photoresist material. In the embodiments in which the opening 25 is filled with a photoresist material, the photoresist composition may include at least a resin binder component and a photoactive agent. A wide variety of polymeric or resin binders may be used in photoresists. Such polymeric binders may include, as polymerized components, one or more acid functional monomers such as acrylic acid or methacrylic acid. In one embodiment, the photoresist layer is composed of DQN photoresist. DQN photoresist is a two component photoresist that includes diazoquinone (DQ)(photosensitive component) and novolac (N-resin). In one embodiment, the photoresist layer is deposited within the opening using spin-on techniques. Spin-on-glass (SOG) as used to provide the sacrificial filler material 35 is a mixture of $SiO_2$ and dopants (either boron or phosphorous) that is suspended in a solvent solution. The spin-on-glass (SOG) is applied by spin-coating similar to the embodiments in which a photoresist material provides the sacrificial filler material 35.

FIG. 6B depicts one embodiment in which a barrier metal layer 36 is formed on the phase change material 30a prior to the deposition of the sacrificial filler material 35. A "barrier metal" is a material used to chemically isolate the phase change material 30a from the metal and/or semiconductor materials, e.g., lower electrode 10 and upper electrode, that provide electrical contact to the phase change material 30a. The barrier metal layer 36 may be a conformal layer that is present on the upper surface of the portion of the phase change material 30a that is present within the opening 25, the sidewalls of the opening 25, and on the upper surface of the portion of the phase change material 30b that is present on the upper surface of the interlevel dielectric layer 20. In one embodiment, the barrier metal layer 36 may be composed of TiN, TaN, TaSiN, TiTaN, TaRuN or combinations thereof. In one embodiment, the barrier metal layer 36 is blanket deposited by a physical deposition process (PVD), such as sputtering. In another embodiment, the barrier metal layer 36 may be deposited by chemical vapor deposition (CVD). In one embodiment, the layer of the barrier metal layer 36 may have a thickness ranging from about 20 nm to about 100 nm.

Referring to FIGS. 6A and 6B, a planarization step may be applied to the sacrificial filler material 35 to produce an upper surface that is coplanar with the upper surface of the portion of the phase change material 30b that is present on the upper surface of the interlevel dielectric layer 20. Referring to FIG. 6B, in the embodiments in which the barrier metal layer 36 is formed prior to the sacrificial filler material 35, the planarization step removes the portion of the barrier metal layer 36 that is present overlying the upper surface of the portion of the phase change material 30b that is present on the upper surface of the interlevel dielectric layer 20. In some embodiments, the planarization step may be provided by chemical mechanical planarization (CMP).

Figure 7:
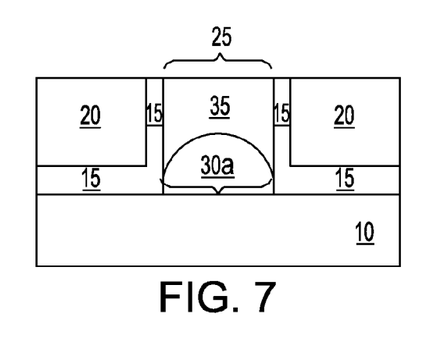
FIG. 7 depicts one embodiment of planarizing the structure depicted in FIG. 6A to remove the phase change material that is present on the upper surface of the interlevel dielectric layer, in accordance with one embodiment of the present disclosure.

FIG. 7 depicts one embodiment of removing the portion of the phase change material 30b that is present overlying the upper surface of the interlevel dielectric layer 20. In one embodiment, the portion of the phase change material 30b that is present overlying the upper surface of the interlevel dielectric layer 20 is removed by a planarization process, such as chemical mechanical planarization (CMP). The planarization process typically stops on the upper surface of the interlevel dielectric layer 20. The planarization process also removes a portion of the sacrificial filler material 35 that is present within the opening 25. FIG. 7 depicts planarization of the structure depicted in FIG. 6A. Planarization of the structure depicted in FIG. 6B would provide a structure similar to the structure depicted in FIG. 7 with the exception of the addition of the metal barrier layer 36 having an upper surface coplanar with the upper surface of the interlevel dielectric layer 20 and the sacrificial filler material 35.

Figure 8:
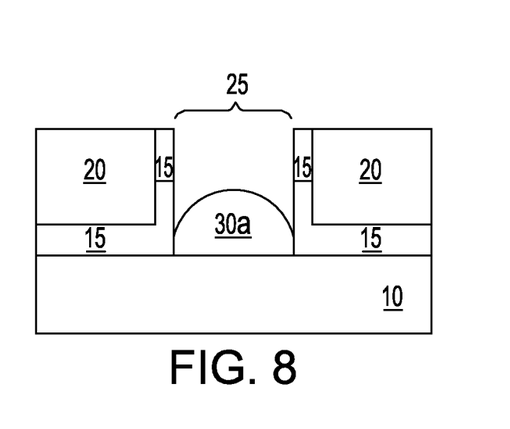
FIG. 8 is a side cross-sectional view depicting removing the spin-on-glass or the photoresist material that is filling the opening to expose the phase change material present therein, in accordance with one embodiment of the present disclosure.

FIG. 8 depicts one embodiment of removing the remaining sacrificial filler material 35, e.g., spin-on-glass or the photoresist material, that is filling the opening 25 to expose the phase change material 30a that is present therein. In one embodiment, the remaining sacrificial filler material 35 is removed by a selective etch process. The etch that removes the remaining sacrificial filler material 35 may be selective to the phase change material 30a that is present within the opening 25. The etch 35 may also be selective to the conformal layer 15 and the interlevel dielectric layer 20. In one embodiment, the etch process that removes the remaining sacrificial filler material 35 may be an anisotropic etch or an isotropic etch. The etch process may be a dry or a wet etch. In one embodiment in which the remaining sacrificial filler material 35 is composed of a photoresist or spin-on-glass (SOG), the interlevel dielectric layer 20 is composed of silicon oxide ($SiO_2$), the conformal layer 15 is composed of silicon nitride ($Si_3N_4$), and the phase change material 30a is composed of $Ge_2Sb_2Te_5$ (GST), the etch 35 may be a wet etch composed of dilute hydrofluoric acid (DHF).

Figure 9:
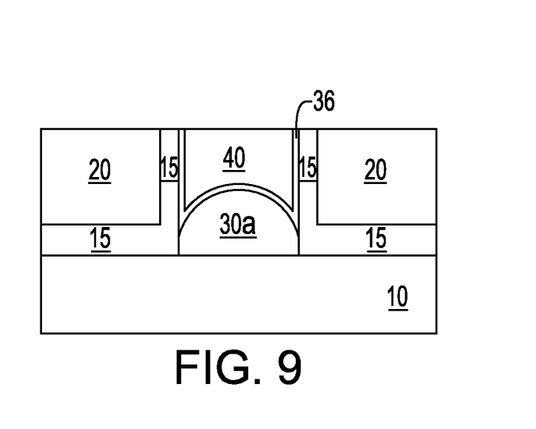
FIG. 9 is a side cross-sectional view depicting depositing a metal barrier layer within the opening, depositing a conductive fill material within the opening, and planarizing the conductive fill material to provide a bit line, in accordance with one embodiment of the present disclosure.

FIG. 9 illustrates one embodiment of depositing a depositing a conductive fill 40 material within the opening 25 and planarizing the conductive fill material 40. The conductive fill material 40 may provide the bit line that is in electrical communication with the phase change material 30a. In one embodiment, the bit line is used to transfer data for both read and write operations to the phase change material 30a of a phase change random access memory (PCRAM) device. In one embodiment, the conductive fill 40 that provides the bit line and the phase change material 30a are both contained within the opening 25, hence providing where the phase change material 30a and the bit line are self-aligned. In one embodiment, the conductive fill 40 is formed atop the substrate using deposition. More specifically, in one embodiment of the disclosure, the conductive fill material 40 is formed by a deposition process including, for example, chemical vapor deposition (CVD) or physical vapor deposition (PVD). Examples of physical vapor deposition (PVD) methods that are suitable for forming the conductive fill material 40 include plating and sputtering. Illustrative examples of suitable materials for the conductive fill material include, but are not limited to, copper (Cu), tungsten (W), titanium (Ti), aluminum (Al), nickel (Ni), tantalum (Ta), gold (Au), silver (Ag), metal semiconductor alloys or combinations thereof. In one example, the conductive fill 40 is composed of plated copper (Cu). In another example, the conductive fill material 40 is composed of tungsten (W) deposited by chemical vapor deposition.

In the embodiments in which the barrier metal layer 36 is not formed prior to filling the opening 25 with the filler material 35, the barrier metal layer 36 may be formed on the phase change material 30a after removing the filler material 35 and before filling the opening 25 with the conductive fill material 40.

Still referring to FIG. 9, following deposition of the conductive fill material 40, a planarization process may be applied to the conductive fill material 40 so that the upper surface of the conductive fill material 40 is coplanar with the upper surface of the conformal layer 15 and the interlevel dielectric layer 20. The planarization process may be chemical mechanical planarization (CMP).

Figure 10:
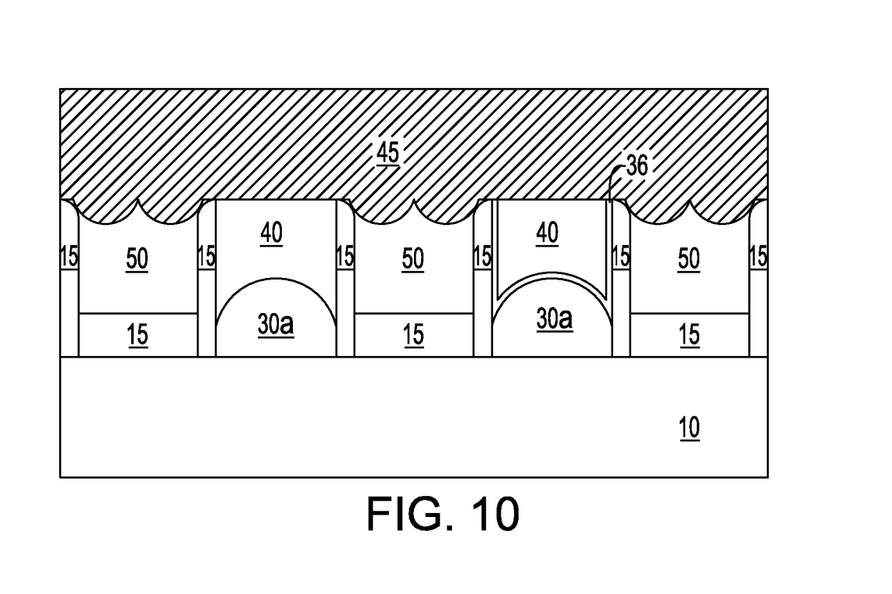
FIG. 10 depicts a side cross-sectional view of one embodiment of the present disclosure, in which air gaps are present separating adjacent bit lines.

FIG. 10 depicts one embodiment of the present disclosure in which the interlevel dielectric layer 20 is removed after forming the conductive fill material 40. A bridging dielectric layer 45 can be deposited to provide enclosed air gaps 50 separating adjacent bit lines, i.e., portions of the conductive fill material 40. The interlevel dielectric layer 20 may be removed by a wet etch that is selective to the conformal layer 15, the lower electrode 10, and the conductive fill material 40. In one embodiment in which the lower electrode 10 and the conformal layer 15 are composed of silicon nitride ($Si_3N_4$), the conductive fill material 40 is composed of tungsten (W) or copper (Cu), and the interlevel dielectric layer 20 is composed of silicon oxide ($SiO_2$), the interlevel dielectric layer 20 may be removed by an etch composed of dilute hydrofluoric acid (DHF). The air gap 50 may be comprised of a gas from the ambient air. The bridging dielectric layer 45 may be composed of any dielectric material that can extend from the upper surface of one bit line, i.e., conductive fill material 40, to the upper surface of an adjacent bit line, i.e., conductive fill material 40. In one embodiment, the bridging dielectric layer 45 includes, but is not limited to, an oxide, nitride, oxynitride and/or silicates, aluminates, titanates and nitrides. In one example, when the bridging dielectric layer 45 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixtures thereof. In another embodiment, the bridging dielectric layer 45 is composed of a nitride, such as silicon nitride. The physical thickness of the bridging dielectric layer 45 may vary, but typically, the bridging dielectric layer 45 has a thickness ranging from 5 nm to 60 nm.

The bridging dielectric layer 45 may be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. In one example, the bridging dielectric layer 45 is composed of silicon nitride ($Si_3N_4$) deposited by plasma enhanced chemical vapor deposition using precursor gasses including $SiH_4$, $NH_3$, and $N_2$ at a pressure ranging from 2 Tor to 5 Tor at a temperature ranging from 400° C. to 480° C. It is noted that the above deposition processes are provided for illustrative purposes only, and are not intended to limit the present disclosure, as the bridging dielectric layer 45 may be formed using any deposition method that does not fill the air gap 50.

FIGS. 11-17 depict one embodiment of a self-aligned etch back process for removing excess upper electrode material without damaging the upper electrode material that is present in electrical contact with the phase change material of a phase change memory device, such as a phase change random access memory (PCRAM) device.

Figure 11:
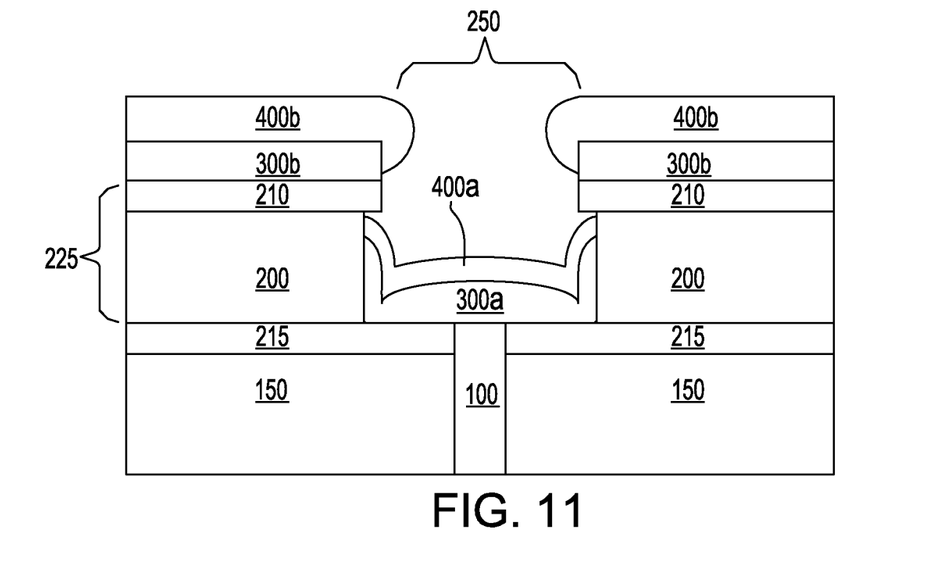
FIG. 11 is a side cross-sectional view of an initial structure for one embodiment of a self-aligned etch back process that includes forming an upper electrode on a phase change material that is present within an opening through a material stack, in accordance with one aspect of the present disclosure.

FIG. 11 depicts one embodiment of an initial structure that may be employed in a method of forming a memory device, in accordance with at least one other aspect of the present disclosure. The initial structure typically includes a lower electrode 100 that is positioned on or within a substrate 150. The substrate 150 may comprise any semiconductor material including, but not limited to, Si, Ge, SiGe, SiC, SiGeC, InAs, GaAs, InP and other III/V compound semiconductors. The lower electrode 100 may be formed of an electrically conductive material.

In one embodiment, the lower electrode 100 is formed through the substrate 150 using photolithography, etch, and deposition methods. The lower electrode 100 that is depicted in FIG. 11 is similar to the lower electrode 10 that is described above with reference to FIG. 1. The above description of the lower electrode 10 is applicable to the lower electrode 100 that is described with reference to FIG. 11.

In one embodiment, the initial structure is formed by a method that includes providing an opening 250 through a material stack 225 to a lower electrode 100 and depositing a phase change material 300a on an exposed surface of the lower electrode 100. The material stack 225 typically includes an interlevel dielectric layer 200 that is similar to the interlevel dielectric layer 20 that is described above with reference to FIG. 3. The above description of the interlevel dielectric layer 20 is applicable to the interlevel dielectric layer 200 that is described with reference to FIG. 11. In one example, the interlevel dielectric layer 20 is composed of silicon oxide ($SiO_2$).

In one embodiment, the material stack 225 may also include a planarization stop layer 210. The planarization stop layer 210 may be a dielectric material, such as an oxide, nitride or oxynitride material, that is deposited atop the interlevel dielectric layer 200. The planarization stop layer 210 may have a thickness ranging from 10 nm to 50 nm. The planarization stop layer 210 may be deposited using chemical vapor deposition, evaporation, chemical solution deposition, spin-on-deposition, or a combination thereof. In one example, the planarization stop layer 210 may be composed of silicon nitride ($Si_3N_4$). A second planarization stop layer 215 may be present separating the interlevel dielectric layer 200 from the underlying substrate 150.

Still referring to FIG. 11, an opening 250 is formed through the material stack 22 to the lower electrode 100 using photolithography and selective etch methods. A phase change material 300a, 300b is then deposited, in which a first portion of the phase change material 300a is formed within the opening 250 and on the exposed portion of the lower electrode 100, and a second portion of the phase change material 300b is formed on the upper surface of the material stack 225. The phase change material 300a, 300b depicted in FIG. 11 is similar to the phase change material 30a, 30b that is described above with reference to FIG. 5. The above description of the phase change material 30a, 30b is applicable to the phase change material 300a, 300b that is described with reference to FIG. 11. In one example, the phase change material 300a, 300b has a composition of $Ge_2Sb_2Te_5$ (GST).

An upper electrode 400a may be formed on the phase change material 300a that is present within the opening 250. A portion of the electrically conductive material 400b that provides the upper electrode 400a is also formed on the portion of the phase change material 300b that is on the upper surface of the material stack 225. More specifically and in one embodiment of the disclosure, the upper electrode 400a and the electrically conductive material 400b is deposited by chemical vapor deposition (CVD) or physical vapor deposition (PVD). Examples of physical vapor deposition (PVD) methods that are suitable for forming the upper electrode 400a include plating and sputtering. Illustrative examples of suitable materials for the upper electrode 400a and the electrically conductive material 400b include, but are not limited to, copper (Cu), tungsten (W), titanium (Ti), aluminum (Al), nickel (Ni), tantalum (Ta), gold (Au), silver (Ag), metal semiconductor alloys or combinations thereof. In one example, the upper electrode 400a and the electrically conductive material 400b is composed of plated copper (Cu). In another example, the upper electrode 400a and the electrically conductive material 400b is composed of tungsten (W) deposited by chemical vapor deposition (CVD).

Figure 12:
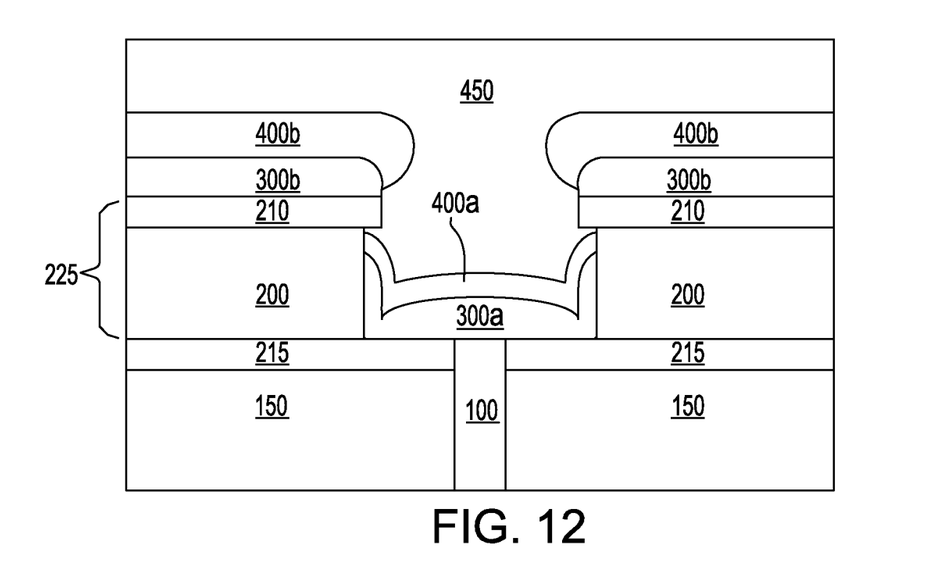
FIG. 12 is a side cross-sectional view depicting filling the opening with an etch stop material, in accordance with one embodiment of the present disclosure.

FIG. 12 depicts one embodiment of filling the opening 250 with an etch stop material 450. Because the etch stop material 450 is formed in the same opening 250 that contains the upper electrode 400a and the phase change material 300a, the etch stop material 450 is aligned to the upper electrode 400a and the phase change material 300a. The etch stop material 450 provides a self-aligned etch back process, because the etch stop material 450 is aligned to the upper electrode 400a and the phase change material 300a, and protects the upper electrode 400a and the phase change material 300a while the electrically conductive material 400b and the second portion of the phase change material 300b is being removed.

Figure 13:
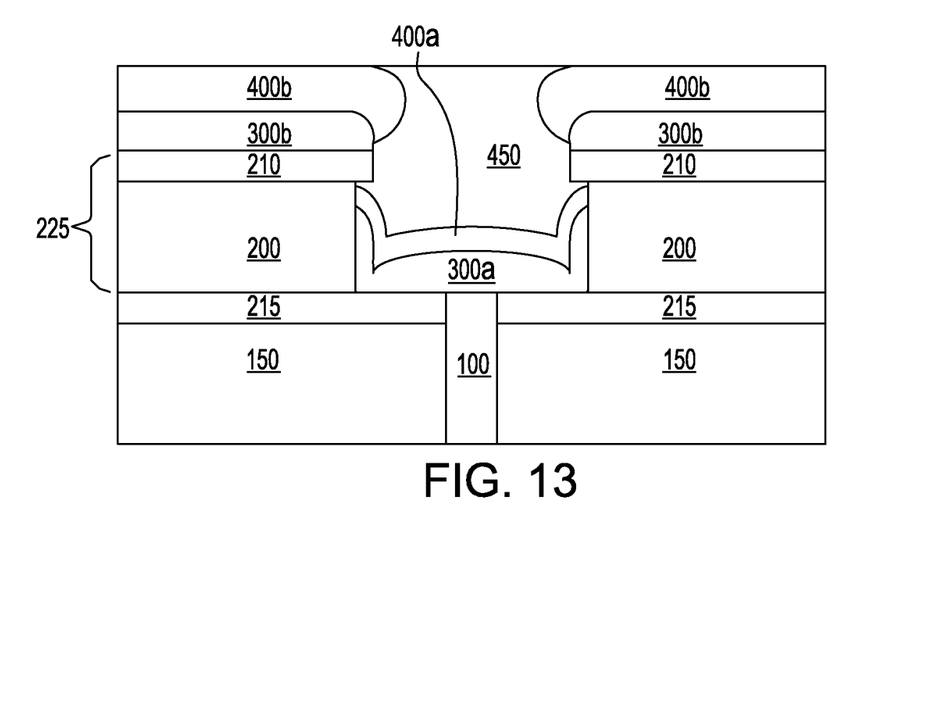
FIG. 13 is a side cross-sectional view depicting planarizing the structure depicted in FIG. 12 until the portion of the upper electrode that is present outside the opening has an upper surface that is coplanar with the upper surface of the etch stop material, in accordance with one embodiment of the present disclosure.

In some embodiments, the etch stop material 450 may be a spin-on-glass or photoresist material. The etch stop material 450 that is depicted in FIG. 12 is similar to the sacrificial filler material 35 that is described above with reference to FIGS. 6A and 6B. The above description of the sacrificial filler material 35 is applicable to the etch stop material 450 that is described with reference to FIG. 11. It is noted that other materials are suitable for the etch stop material 450, so long as the material that is selected can protect the upper electrode 400a that is present within the opening 250 during the planarization and etch process that remove the electrically conductive material 400b and the second portion of the phase change material 300b. In one embodiment, the etch stop material 450 may be planarized so that the upper surface of the etch stop material 450 is coplanar with the upper surface of the electrically conductive material 400b that is present overlying the material stack 225, as depicted in FIG. 13.

Figure 14:
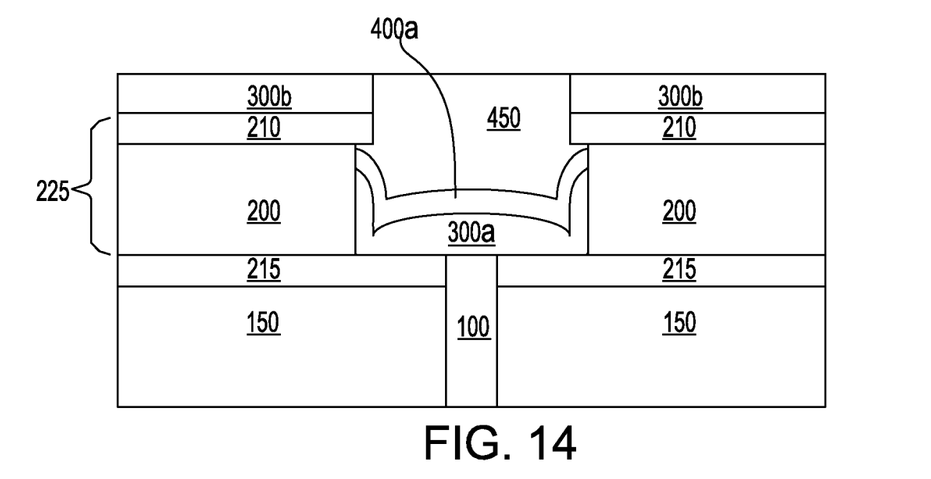
FIG. 14 is a side cross-sectional view depicting etching the portion of the upper electrode that is present overlying the upper surface of the material stack, wherein the upper electrode that is present within the opening is protected by the etch stop material, in accordance with one embodiment of the present disclosure.

FIG. 14 depicts one embodiment of removing the electrically conductive material 400b that is present on the material stack 225, while the upper electrode 400a that is present in the opening 250 is protected by the etch stop material 450. In one embodiment, the electrically conductive material 400b may be removed by an etch process that is selective to the etch stop material 450. The etch process that removes the electrically conductive material 400b may also be selective to the second portion of the phase change material 300b that is present overlying the material stack 225. In one example, in which the etch stop material 450 is composed of photoresist, the electrically conductive material 400b is composed of tungsten (W) or copper (Cu), and the second portion of the phase change material 300b is composed of $Ge_2Sb_2Te_5$ (GST), the etch that removes the electrically conductive material 400b may be a reactive ion etch or a chemical mechanical polish process. In one embodiment, in which the electrically conductive material 400b is composed of copper (Cu), the electrically conductive material 400b may be removed by selective chemical mechanical planarization (CMP). In another embodiment, in which the electrically conductive material 400b is composed tungsten (W), the electrically conductive material 400b may be removed by selective etching, in which the etch chemistry is composed of Ar/Cl$_2$. In another embodiment, the etch that removes the electrically conductive material 400b also removes the second portion of the phase change material 300b that is present overlying the material stack 225.

Figure 15:
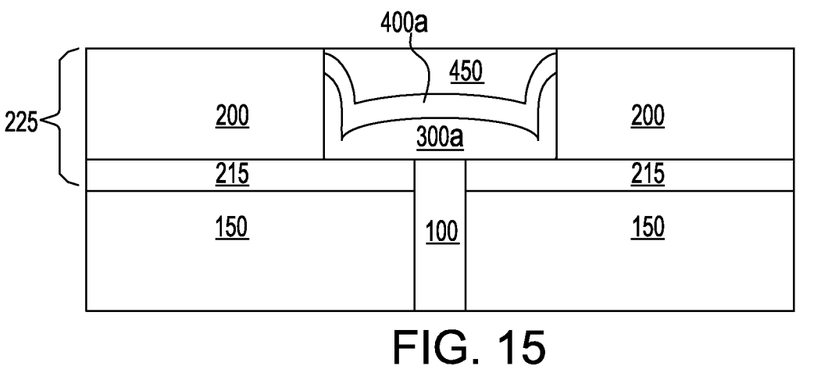
FIG. 15 is a side cross-sectional view depicting planarizing to remove the portion of the phase change material that is present on the upper surface of the material stack stopping on the planarization stop layer, in accordance with one embodiment of the present disclosure.

In the embodiments in which the second portion of the phase change material 300b is not removed by etch process that removes the electrically conductive material 400b, a planarization process, such as chemical mechanical planarization (CMP), removes the second portion of the phase change material 300b, as depicted in FIG. 15. In one embodiment, the planarization process terminates on the planarization stop layer 210.

Figure 16:
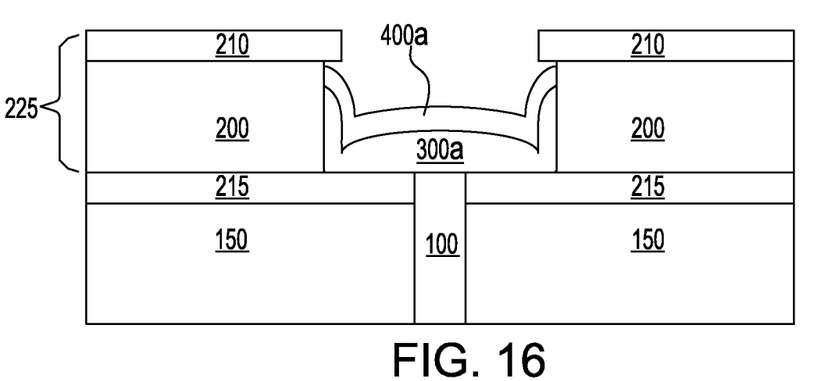
FIG. 16 depicts a side cross-sectional view of removing the etch stop material with an etch that is selective to the upper electrode and the material stack, in accordance with one embodiment of the present disclosure.

FIG. 16 depicts one embodiment of removing the etch stop material 450 with an etch that is selective to the upper electrode 400a and the material stack 225. In one embodiment, the etch stop material 450 is removed by a selective etch process. The etch that removes the etch stop material 450 may be selective to the upper electrode 400a that is present within the opening 250. The etch that removes the sacrificial filler material 35 may also be selective to the material stack 225, e.g., planarization stop layer 210. In one embodiment, the etch process that removes the etch stop material 450 may be an anisotropic etch or an isotropic etch. The etch process that removes the etch stop material 450 may be a dry or a wet etch. In one embodiment, in which the etch stop material 450 is composed of a photoresist or spin-on-glass (SOG), the planarization stop layer 210 is composed of silicon oxide (SiO$_2$), and the upper electrode 400a is composed of copper (Cu), the etch that removes the etch stop material 450 may be a wet etch composed of ammonium persulfate.

Figure 17:
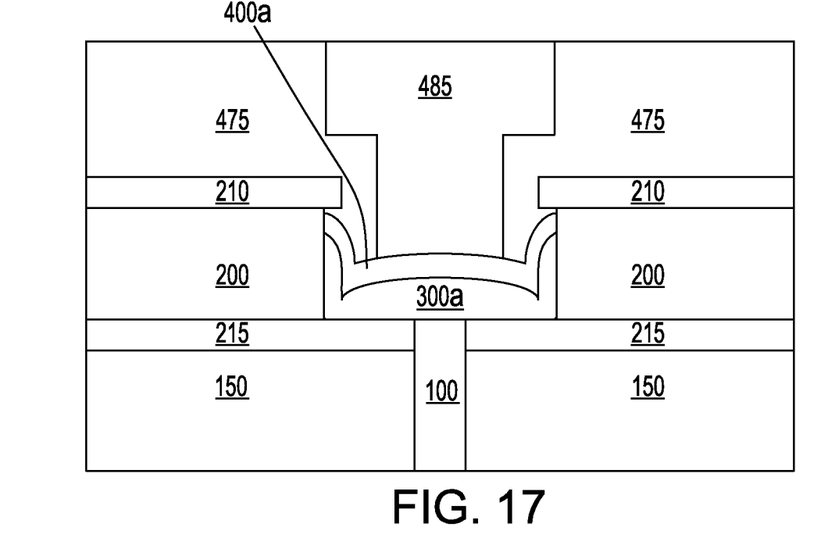
FIG. 17 is a side cross-sectional view of forming a via in electrical communication with the upper electrode.

Referring to FIG. 17 and in one embodiment of the present method, following removal of the etch stop material 450, a layer of dielectric material 475 (hereafter referred to as blanket dielectric 475) is blanket deposited atop the structure depicted in FIG. 16. The blanket dielectric 475 may be selected from the group consisting of silicon-containing materials such as SiO$_2$, Si$_3$N$_4$, SiO$_x$N$_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon). Additional choices for the blanket dielectric 475 include: any of the aforementioned materials in porous form, or in a form that changes during processing to or from being porous and/or permeable to being non-porous and/or non-permeable.

The blanket dielectric 475 may be formed by various methods including, but not limited to, spinning from solution, spraying from solution, chemical vapor deposition (CVD), plasma enhanced CVD (PECVD), sputter deposition, reactive sputter deposition, ion-beam deposition, and evaporation. Following deposition the blanket dielectric may be planarized to provide a planar upper surface, wherein the planarization process may include chemical mechanical planarization (CMP).

The deposited blanket dielectric 475 is then patterned and etched to form via holes to the upper electrode 400a. Following via formation, interconnects 485 are formed by depositing a conductive metal into the via holes using conventional processing, such as CVD or plating. The conductive metal may include, but is not limited to: tungsten, copper, aluminum, silver, gold, and alloys thereof.

While the present disclosure has been particularly shown and described with respect to the preferred embodiments thereof, it will be understood by those skilled in the art that the foregoing and other changes in forms of details may be made without departing form the spirit and scope of the present disclosure. It is therefore intended that the present disclosure not be limited to the exact forms and details described and illustrated, but fall within the scope of the appended claims.

What is claimed is:

1. A method of forming a device comprising:
   forming a pedestal of a sacrificial material on a portion of a lower electrode;
   forming at least one dielectric material adjacent to the sacrificial material, the at least one dielectric material has an upper surface substantially coplanar with an upper surface of the pedestal of the sacrificial material;
   removing the pedestal of the sacrificial material selective to the at least one dielectric material and the lower electrode to provide an opening to an exposed surface of the lower electrode;
   depositing a phase change material on the exposed surface of the lower electrode, wherein the phase change material is in contact with each sidewall of the opening that is provided by the at least one dielectric material; and
   filling the opening with a conductive fill material.

2. The method of claim 1, wherein the lower electrode is composed of silicon nitride.

3. The method of claim 1, wherein the forming of the pedestal of the sacrificial material comprises depositing the sacrificial material composed of amorphous silicon on the lower electrode, and etching a portion of the sacrificial material, wherein a remaining portion of the sacrificial material is present on an upper surface of the lower electrode.

4. The method of claim 1 wherein the forming of the at least one dielectric material adjacent to the pedestal of the sacrificial material comprises:
   forming a conformal layer on the pedestal of the sacrificial material;
   forming an interlevel dielectric layer on the conformal layer; and
   planarizing to remove a portion of the interlevel dielectric layer and the conformal dielectric layer overlying the pedestal of the sacrificial material.

5. The method of claim 4, wherein the forming of the conformal layer on the pedestal of the sacrificial material comprises deposition of the conformal layer comprised of a nitride on the upper surface of the pedestal, sidewalls of the pedestal and exposed portions of the lower electrode that are adjacent to the pedestal.

6. The method of claim 4, wherein the forming of the interlevel dielectric layer on the conformal layer comprises depositing an oxide.

7. The method of claim 4 further comprising removing the interlevel dielectric layer selective to the conformal dielectric layer after filling the openings with the conductive fill material to provide air gaps, and depositing a bridging dielectric material enclosing the air gaps between adjacent conductive fill material portions.

8. The method of claim 1, wherein the removing of the pedestal of the sacrificial material comprises a selective etch that removes the sacrificial material of the pedestal selectively to the lower electrode and the at least one dielectric material.

9. The method of claim 1, wherein the depositing of the phase change material on the exposed surface of the lower electrode comprises a Ta-containing material deposited by physical vapor deposition, wherein the phase change material is also formed on the upper surface of the at least one dielectric material.

10. The method of claim 9, wherein the filling of the opening with the conductive fill material comprises:
    depositing a spin-on-glass or photoresist material filling the opening;
    planarizing to remove the phase change material that is present on the upper surface of the at least one dielectric material;
    removing the sacrificial filler material that is filling the opening;
    depositing a barrier layer within the opening;
    depositing the conductive fill material within at least the opening; and
    planarizing the conductive fill material, wherein the upper surface of the conductive fill material is substantially coplanar with the upper surface of the at least one dielectric material.

11. The method of claim 1, wherein the device is a phase change memory device.

12. The method of claim 1, wherein the conductive fill material provides a bit line that is aligned to the phase change material.

13. The method of claim 1, wherein the phase change material has a same width as the pedestal of the sacrificial material.

14. The method of claim 13, wherein the pedestal of the sacrificial material has a width ranging from 20 nm to 250 nm.

15. The method of claim 1, wherein the phase change material is comprised of Ge, Sb, Te or a combination thereof.

16. The method of claim 1, wherein the phase change material is $Ge_2Sb_2Te_5$.

17. The method of claim 1, wherein the conductive fill material comprises Cu, W, Ti, Al, Ni, Ta, Au, Ag, metal semiconductor alloys or combinations thereof.

* * * * *